(12) United States Patent
Janardhanan et al.

(10) Patent No.: US 12,106,402 B2
(45) Date of Patent: Oct. 1, 2024

(54) ARCHITECTURE FOR ARTIFICIAL INTELLIGENCE-BASED MAGNETIC RESONANCE RECONSTRUCTION

(71) Applicant: Siemens Healthineers AG, Forchheim (DE)

(72) Inventors: Nirmal Janardhanan, Monmouth Junction, NJ (US); Laszlo Lazar, Gheorgheni (RO); Boris Mailhe, Plainsboro, NJ (US); Simon Arberet, Princeton, NJ (US); Mariappan S. Nadar, Plainsboro, NJ (US); Dorin Comaniciu, Princeton, NJ (US); Kelvin Chow, Chicago, IL (US); Michael Bush, Brooklyn, NY (US)

(73) Assignee: Siemens Healthineers AG, Forchheim (DE)

( * ) Notice: Subject to any disclaimer, the term of this patent is extended or adjusted under 35 U.S.C. 154(b) by 454 days.

(21) Appl. No.: 17/450,075

(22) Filed: Oct. 6, 2021

(65) Prior Publication Data

US 2023/0108663 A1    Apr. 6, 2023

(51) Int. Cl.
*G06T 11/00*    (2006.01)
*G01R 33/48*    (2006.01)
*G06T 7/00*    (2017.01)

(52) U.S. Cl.
CPC ........ *G06T 11/005* (2013.01); *G01R 33/4818* (2013.01); *G06T 7/0012* (2013.01); *G06T 2207/10088* (2013.01)

(58) Field of Classification Search
CPC ................ G06T 11/005; G06T 7/0012; G06T 2207/10088; G01R 33/4818; G01R 33/5608; G06N 3/0455; G06N 3/0464; G06N 3/084; G06N 20/10
USPC ......................................................... 382/131
See application file for complete search history.

(56) References Cited

U.S. PATENT DOCUMENTS

| | | | |
|---|---|---|---|
| 11,246,524 B2* | 2/2022 | Szabados | A61B 5/02405 |
| 2013/0300414 A1* | 11/2013 | Guerin | G01R 33/288 324/309 |
| 2019/0172230 A1 | 6/2019 | Mailhe et al. | |
| 2020/0326393 A1* | 10/2020 | Johnson | G01R 33/563 |
| 2020/0408864 A1 | 12/2020 | Mailhe | |
| 2021/0150783 A1 | 5/2021 | Arberet et al. | |
| 2022/0055689 A1* | 2/2022 | Mandlekar | B60W 30/06 |
| 2022/0116569 A1* | 4/2022 | Xiong | G06V 10/82 |
| 2022/0147802 A1* | 5/2022 | Liang | G06N 3/063 |
| 2022/0253627 A1* | 8/2022 | Park | G06T 5/92 |

(Continued)

OTHER PUBLICATIONS

U.S. Appl. No. 17/155,630, filed Jan. 22, 2021.

(Continued)

*Primary Examiner* — Ali Bayat

(57) ABSTRACT

For magnetic resonance (MR) reconstruction using artificial intelligence (AI), the AI-based reconstruction for MR imaging systems is offloaded to one or more servers. A remote server performs AI-based reconstruction. A library of recent, old, custom, and/or publicly available AI-based reconstruction processes may be rapidly deployed and available to the server, which has the memory and processing resources for AI-based reconstruction. Load balancing of the data and/or between servers may improve performance.

18 Claims, 4 Drawing Sheets

(56) References Cited

U.S. PATENT DOCUMENTS

2022/0318296 A1* 10/2022 Vang .................. G06V 10/82
2023/0055826 A1*  2/2023 Wu .................. G01R 33/5608

OTHER PUBLICATIONS

U.S. Appl. No. 17/303,790, filed Jun. 8, 2021.
U.S. Appl. No. 17/473,229, filed Sep. 13, 2021.
European Search Report for Application No. EP22199582.2 dated Feb. 3, 2023. (10 pages).
Zhao, Ruiyang, et al. "End-to-end AI-based MRI reconstruction and lesion detection pipeline for evaluation of deep learning image reconstruction." arXiv preprint arXiv:2109.11524 (2021).
Xue, Hui, et al. "Distributed MRI reconstruction using gadgetron-based cloud computing." Magnetic resonance in medicine 73.3 (2015): 1015-1025.

* cited by examiner

ARCHITECTURE FOR ARTIFICIAL INTELLIGENCE-BASED MAGNETIC RESONANCE RECONSTRUCTION

FIELD

This disclosure relates to medical image reconstruction for magnetic resonance (MR) imaging.

BACKGROUND

In MR imaging, machine learning-based or artificial intelligence (AI) reconstruction solutions show improved image quality compared to traditional reconstruction techniques. An AI solution is directly deployed on and by the MR imaging system. However, AI reconstruction processes have high memory and computation power usage. In the MR imaging system, the scanner computer may have limited hardware capabilities and resources. The approaches for AI solutions are fast evolving, yet the MR imaging system may not be updated rapidly.

SUMMARY

By way of introduction, the preferred embodiments described below include methods, systems, instructions, and non-transitory computer readable media for MR reconstruction using AI. The AI-based reconstruction for MR imaging systems is offloaded to one or more servers. A remote server performs AI-based reconstruction. A library of recent, old, custom, and/or publicly available AI-based reconstruction processes may be rapidly deployed and available to the server, which has the memory and processing resources for AI-based reconstruction. Load balancing of the data and/or between servers may improve performance.

In a first aspect, a system is provided for magnetic resonance (MR) reconstruction in medical imaging. An MR scanner is configured to scan a region of a patient. The scan provides k-space data. A scanner processor of the MR scanner is configured to format the k-space data for transmission over a computer network. A server remote from the MR scanner communicatively connects to the scanner processor by the computer network. The server is configured to reconstruct a representation from the k-space data with a reconstruction using a first machine-learned model selected from a library. A display of the MR scanner is configured to display an image from the representation.

In one embodiment, the scanner processor is a reconstruction processor of the MR scanner. The reconstruction processor is in an adjacent room with coils of the MR scanner. The server is outside of the adjacent room. The computer network is a local-area network, a wide-area network, or the Internet.

In other embodiments, the scanner processor is configured to format the k-space data pursuant to an International Society of Magnetic Resonance in Medicine Raw Data format or another format for communicating k-space and/or medical imaging information.

The server is a supercomputer or a workstation having greater processing power than the scanner processor where the scanner processor is a reconstruction processor of the MR scanner. Other servers may be used.

In an embodiment, the scanner processor is configured to extract the k-space data from an imaging process of the MR scanner, to receive the image or the representation from the image processor, and to inject the received image or the received representation into the imaging process of the MR scanner.

In one embodiment, the server is configured to select the first machine-learned model from a library of multiple machine-learned models accessible to the server. For example, the library includes a first set of the multiple machine-learned models in Python and a second set of the multiple machine-learned models in another language with a Python wrapper. As a further example, the first set is publicly available machine-learned models, and the second set is custom machine-learned models that are publicly unavailable.

As another embodiment, the server is configured to load balance with splitting of the k-space data for the scan of the patient. In yet another embodiment, the server is one of multiple servers, and the MR scanner is one of multiple MR scanners where k-space data from different ones of the MR scanners are load balanced between the multiple servers.

In a second aspect, a method is provided for magnetic resonance (MR) reconstruction in medical imaging. K-space data is received over a computer network at a server from a remote MR imager. The server load balances the k-space data. A first reconstruction process is selected from a library of reconstruction processes. The reconstruction processes of the library include different machine-learned models, respectively. A representation is reconstructed from the load-balanced k-space data with the selected first reconstruction process and corresponding machine-learned model. The representation or an image from the representation is transmitted to the remote MR imager over the computer network.

In one embodiment, the receiving and transmitting are performed with the data in an International Society of Magnetic Resonance in Medicine Raw Data format. The remote MR imager is in a different building than the server, and the server is a supercomputer.

For load balancing, the k-space data for a scan of a patient is separated into separate processing blocks for different processing units (e.g., central processing unit cores or graphics processing units) of the server. Alternatively, or additionally, the load balancing assigns a processor for the reconstructing, such as assigning a sever to reconstruct.

For selecting, the library includes publicly available reconstruction processes and custom reconstruction processes. The library may include other types of reconstruction processes, including AI and non-AI.

In a third aspect, a system is provided for magnetic resonance (MR) reconstruction in medical imaging. An interface is configured to receive k-space data from a plurality of different MR imagers in one or more different facilities than the interface. A first server connects with the interface. The first server is configured to load balance the k-space data to different processing units of the first server and to reconstruct representations from the k-space data. The representations are reconstructed using one or more machine-learned models. The interface is configured to communicate the representations and/or images from the representations to the different MR imagers.

In a further multi-server embodiment, a second server is configured to load balance the k-space data between a bank of servers including the first server.

In another embodiment, the first server is configured to select one of a plurality of the machine-learned models for reconstruction of each representation. The plurality of the machine-learned models includes native machine-learned models and internal machine-learned models.

The present invention is defined by the following claims, and nothing in this section should be taken as a limitation on those claims. Further aspects and advantages of the invention are discussed below in conjunction with the preferred embodiments and may be later claimed independently or in combination.

DETAILED DESCRIPTION

A software architecture supported by an arrangement of hardware provides for next generation AI-powered MR imaging reconstruction using a remote computer, such as a supercomputer, workstation, or another type of server in a different room, facility, or complex. For example, deep learning-based AI reconstruction is provided to one or more MR scanners via a remote high performance computer or supercomputer. The remote server may be local in the sense of being in same facility but different room. This deployment of AI reconstruction for MR has flexibility to bring load balancing to handle larger data as needed and allows deployment of a library of different reconstruction processes using machine-learned models on one or more computers having greater computating power and memory than the MR scanners.

Figure 1:
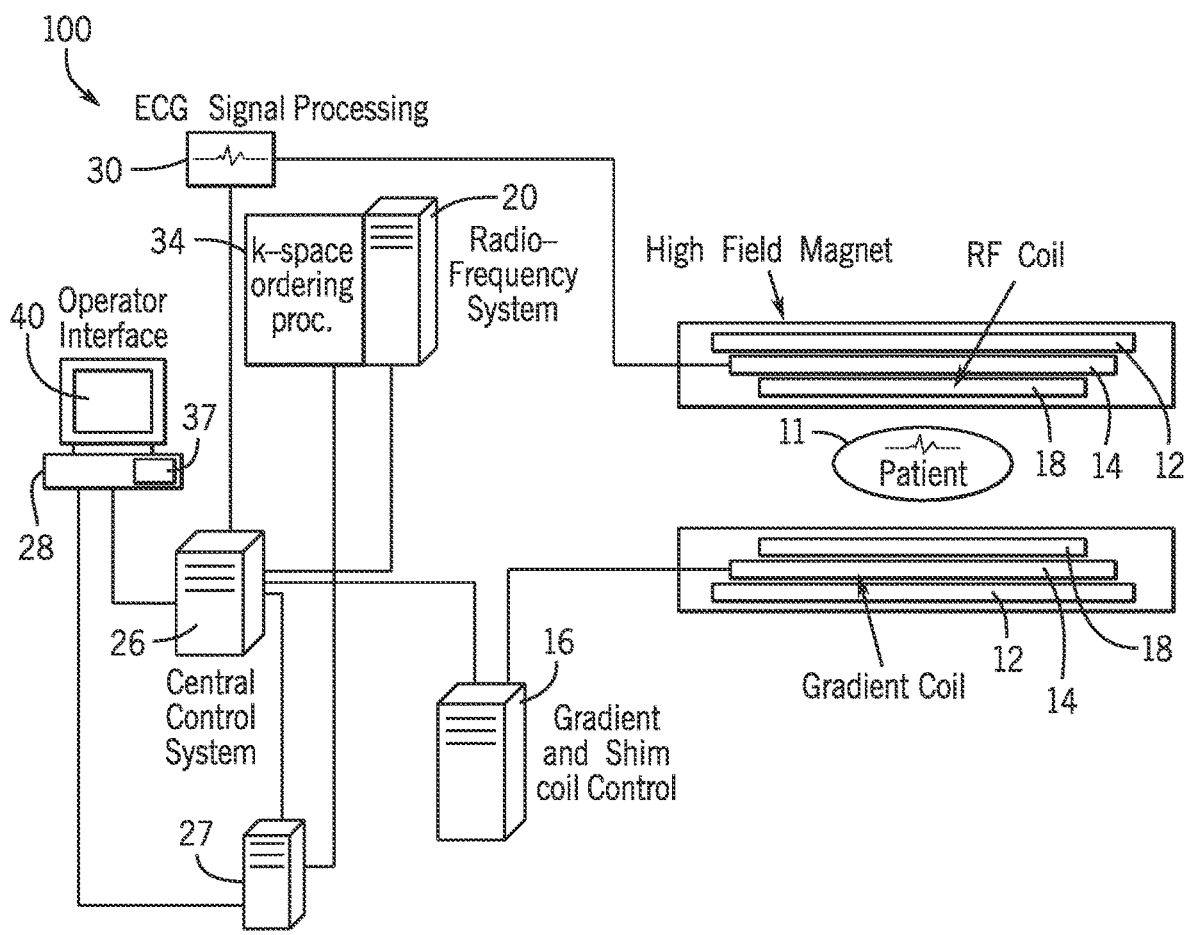
FIG. 1 is a block diagram of an embodiment of an MR system for medical imaging.

FIG. 1 shows an MR scanner, imager, or system 100. The MR scanner 100 is distributed in one or two rooms, such as the coils 12, 14, 18 being in a Faraday cage-protected room with a patient bed for scanning the patient 11 and the computer 28 with or without other electronics being in an adjacent room. The MR scanner 110 may scan a patient and reconstruct a representation of the patient from the k-space data acquired by the scan. The reconstruction processes and the processing and memory available locally or internally for the MR scanner 100 may be limited.

The MR scanning system 100 of FIG. 1 is only exemplary, and a variety of MR scanning systems can be used to collect the MR data. The MR scanner 100 is configured to scan a patient. The system 100 scans a patient to provide k-space measurements (measurements in the frequency domain). Magnetic coils 12 create a static base magnetic field in the body of patient 11. Gradient coils 14 produce position dependent magnetic field gradients superimposed on the static magnetic field in response to gradient signals supplied by a gradient and shim coil control module 16. RF (radio frequency) module 20 provides RF pulse signals to RF coil 18, which in response produces magnetic field pulses that rotate the spins of the protons in the imaged body of the patient 11. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11. The MR signals are detected and processed by a detector within RF module 20 and k-space component processor unit 34 to provide an MR dataset to an image data processor for processing into an image (i.e., for reconstruction in the object domain from the k-space data in the scan domain). In some embodiments, the image data processor is in or is the central control unit 26 or the computer 28. In other embodiments, such as the one depicted in FIG. 1, the image data processor is in a separate unit 27 used as a reconstruction processor. ECG synchronization signal generator 30 provides ECG signals used for pulse sequence and imaging synchronization. A two- or three-dimensional k-space storage array of individual data elements in k-space component processor unit 34 stores corresponding individual frequency components forming an MR dataset.

A generated image of the reconstructed representation (e.g., combined representation) for a given patient is presented on a display screen of an operator interface 40. The computer 28 of the operator interface 40 includes a graphical user interface (GUI) enabling user interaction with central control unit 26. The display processor 37 processes the magnetic resonance signals to provide image representative data for display on the display, for example. The display is a CRT, LCD, plasma, projector, printer, or other display device. The display is configured by loading an image to a display plane or buffer. The display is configured to display the reconstructed MR image of the region of the patient.

Figure 2:
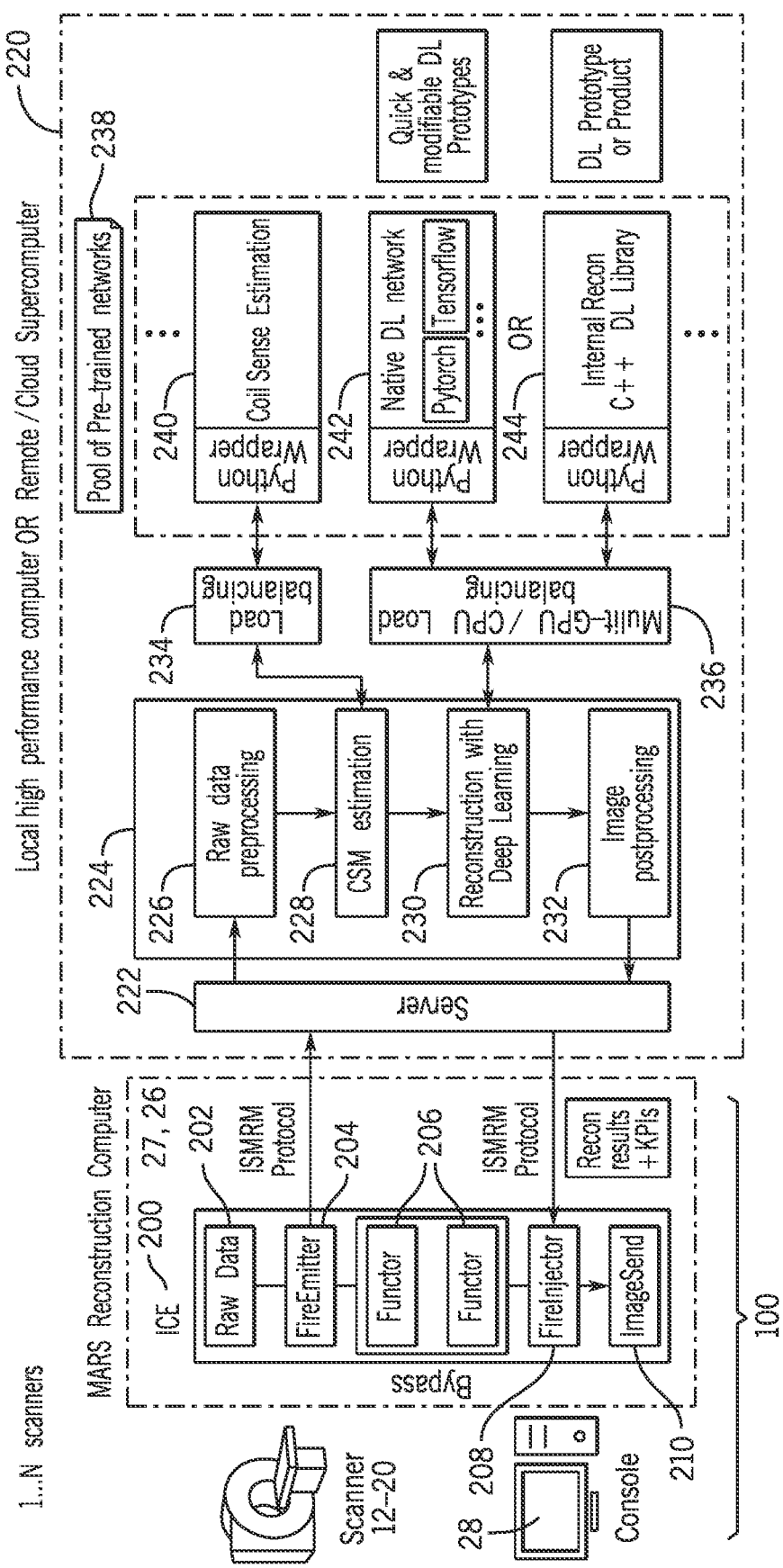
FIG. 2 is a block diagram of an embodiment for AI-based reconstruction remote from the MR system.

For remote reconstruction, the MR scanner 100 transmits the k-space data to a remote server. FIG. 2 shows an example system for MR reconstruction in medical imaging. The central control unit 26, the processing unit 27 (e.g., image processor or graphic processing units), or computer 28 of the MR scanner 100 are a scanner processor for formatting the k-space data for transmission over a computer network. The scanner processor is a processor local to or part of the MR scanner 100 (e.g., in the same rooms). For example, the reconstruction processor (e.g., processing unit 27) formats the k-space data for computer network communications. The computer 28 may format in another embodiment.

Any format may be used. For example, the scanner processor is configured by hardware, software, and/or firmware to format the k-space data pursuant to an International Society of Magnetic Resonance in Medicine Raw Data (ISMRMRD) format. Other formats may be used, such as a format using encoding to reduce bandwidth usage or a DICOM format. Any framework for transmission of k-space data may be used.

The scanner processor is configured to extract the k-space data from an imaging process 200 of the MR scanner 100, such as from a reconstruction or imaging environment process. The process is interrupted or used to extract the k-space data for reconstruction by the remote server. The scanner processor is also configured to receive the image or the representation from the remote server, and to inject the received image or the received representation into the imaging process 200 of the MR scanner 100. In the example of FIG. 2, the raw data 202 is provided to the reconstruction process 200, where an emitter process 204 formats the raw data 202 for transmission over a computer network. The reconstruction process 200 may include various functions 206 for reconstruction, such as pre-processing, reconstruction, and/or post-processing (e.g., filtering or rendering) functions 206. These functions 206 may be bypassed. Alternatively, a local image is reconstructed. The injector 208 receives the results of the remote reconstruction (i.e., the reconstructed representation or an image from representation). Further processing functions 206 may be provided after the injector 208, such as rendering an image from the representation. The reconstructed image is provided to the computer 28 or the display of the computer 28 by an image buffer or image send process 210. Other reconstruction processes 200 with extraction of k-space data and/or receipt of remotely reconstructed information may be used.

A server 220, via a communications interface, receives the raw data 202 or other extracted k-space data from the MR scanner 100. The server 220 is a computer or image processor. In one embodiment, the server 220 is a supercomputer. For example, a main frame computer with massive parallel processing or many processing cores is used. In another embodiment, the server 220 is a workstation, such as a computer with multiple graphics processing units. The workstation has greater processing power than the scanner processor 26, 27, 28, such as greater processing power than the scanner processor 27 used for reconstruction. Other high-performance computers may be used.

The server 220 is remote from the scanner processor 26, 27, 28 and/or the MR imager 100. For example, the server 220 is local in the sense of being in a same building but connects through a computer network instead of directly and is remote by being outside the faraday cage protected room and the adjacent room for the computer 28 and/or other electronics of the MR scanner 100. Greater remoteness may be provided, such as being in a different building of a complex or facility or being in a different zip code, city, county, state, or country. For example, a supercomputer may be located in a different state for most connected MR imagers 100.

The server 220 communicatively connects to the MR imager 100 through a computer network. Any type of computer network for connecting different computer systems together may be used, such as a local area network, a wide area network, the Internet, or combinations thereof. The computer network may be formed from wired and/or wireless connections and may include routers, address servers, edge servers, and/or other devices for routing communications.

FIG. 2 shows one embodiment of processes implemented by the server 220. A server process, operating system thread, or interface 222 receives the k-space data and transmits the reconstructed representation or image from the server 220 to the MR imager 100. The interface 222 may reformat, extract, or perform other communications processes.

For reconstruction, a reconstruction process 224 includes pre-processing 226, coil sensitivity map (CSM) estimation or look-up 228, reconstruction by a machine-learned model (e.g., deep-learned neural network) 230, and any image post-processing 232. Any reconstruction process 224 for generating a representation or image from k-space data may be used.

Machine-learned model-based AI reconstruction is brought to the MR scanner 100 by deploying the reconstruction processor 224 in the server 220. The reconstruction 230 uses the machine-learned model for the entire process (e.g., input pre-processed k-space data and output the representation in the object or image domain) or for part of the reconstruction (e.g., Fourier transform, gradient descent, and/or regularization). Different reconstruction approaches 230 may use different machine-learned models for the same or different components of reconstruction. Any machine-learned model may be used, such as a neural network, support vector machine, fully connected network, or convolutional neural network. The machine-learned model may have any of various architectures, such one or more hidden layers. For example, an image-to-image, U-Net, Dense Net, hierarchal, or another neural network arrangement is used.

The AI-based reconstruction 230 and/or CSM estimation 228 may be processing intensive. Load balancing 234, 236 may be provided for more rapidly reconstructing. The load balancing 234 for the CSM estimation 228 may include use of a machine-learned model or may use a hand-coded algorithm. A plurality of CSM estimation approaches 240 may be provided. The load balancing 236 may be provided for the reconstructing.

The load balancing 234, 236 separates the k-space data and/or processes of the reconstruction process 224 into separate blocks for parallel or sequential processing in a way allowing multiple processes to run at a same time (e.g., one process for gradient decent for one set of data and another process for Fourier transform for a different set of data or parallel processes for Fourier transforms for different parts or subsets of a same set of data). A single computer or processor may run multiple processes, and the load balancing 234, 236 separates the data and/or reconstruction process 224, 230 between the different processing threads to increase the speed of reconstruction. Load balancing between multi-graphics processing units and/or central processing units is provided in other embodiments. In other embodiments, the load balancing 234, 236 balances the processing between separate or different servers. For example (see FIG. 3), multiple MR imagers 100 connect for reconstruction, and the load balancing 234, 236 is between different servers 220 (e.g., k-space data from different ones of the MR scanners 100 are load balanced between the multiple servers 220). The load balancing may provide improved runtime performance and better resource utilization on the server 220.

The server 220 may be configured to select one reconstruction 230 and corresponding machine-learned model from a library 238 of multiple machine-learned models accessible to the server. For a given imaging application (e.g., kidney imaging), type of scan, scan settings, anatomy of interest, and/or type of MR scanner 100, multiple different reconstruction processes 230 may be available. Each or some of them use a machine-learned model. Different machine-learned models are used for the different reconstruction processes 230.

In the example of FIG. 2, the library 238 includes different sub-sets. One sub-set 242 of reconstruction processes 230 and corresponding machine-learned models uses native machine or deep-learned networks. Theses networks may use the Python or other machine-learned network language. The resulting machine-learned model has a Python wrapper for use in the reconstruction 230. Other languages may be used. Pytorch, Tensorflow, or other libraries of publicly available or generally accessible machine-learned models may be included. For example, quick and modifiable deep-learned prototypes are used, such as provided by native deep-learned frameworks in Python (Pytorch/Tensorflow, etc). Another sub-set 244 of reconstruction processes 230 and corresponding machine-learned models uses internal machine or deep-learned networks. A Python wrapper may be used for communications or application, but the machine-learned models are custom models only available based on licensing or with access restricted to a manufacturer or provider (e.g., publicly unavailable). For example, the machine-learned models for the sub-set 244 of reconstruction processes 230 are programmed in C++.

The library 238 allows for flexibility at the server side to choose from a pool of pre-trained networks and corresponding reconstruction processes. Stable reconstructions processes may be provided without having to conform or test for MR imager 100-specific hardware. A greater variety of options for reconstruction may be provided by reconstruction at the server 220 as compared to having to test and import the variety to the many different MR imagers 100.

The image post-processing 232 may be filtering. A reconstructed representation (e.g., data representing a plane or volume) may be output. Alternatively, the representation is reformatted into an image, such as through volume rendering or formatting into a image format. The representation or image is provided to the MR imager 100 for display on the display of the operator interface 40 of the computer 28. The display of the MR imager 100 is configured to display an image from the remotely reconstructed representation.

Figure 3:
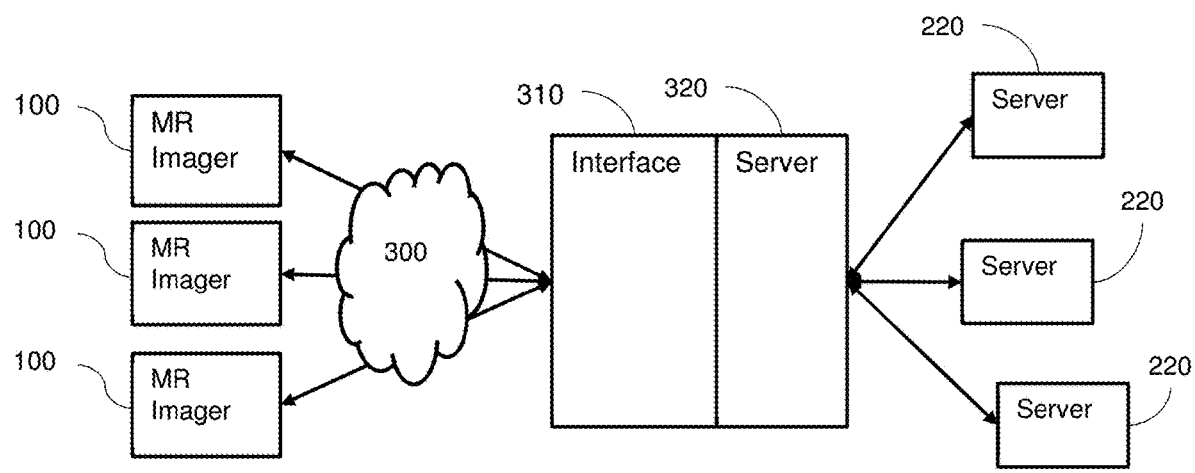
FIG. 3 illustrates an example arrangement for remote, AI-based reconstruction for a network of multiple MR systems and servers.

FIG. 3 shows the system of FIG. 2 in a network of MR imagers 100 and severs 220. Three MR imagers 100 and three severs 220 are shown, but there may be more or less of each, including unequal numbers. For example, there are tens or hundreds of MR imagers 100 and fewer servers 220 by a factor of ten or so (e.g., 10 servers 220 for 100 MR imagers 100). As an alternative, one or more (e.g., all) of the severs 220 are replaced by one supercomputer (e.g., mainframe computer).

The network of FIG. 3 provides for remote reconstruction for the MR imagers 100 using AI or machine-learned models. Multiple scanner clients (i.e., MR imagers 100) connect through one or more computer networks 300 to one or more servers 220. One server 320 may provide for communications and/or load balancing, providing a single server leveraging better resource utilization.

The communications from and to the MR imagers 100 pass through one or more interfaces 310. The interface 310 is configured to receive k-space data from the MR imagers 100 in one or more different facilities than the interface 310. The interface 310 is configured to communicate the representations and/or images from the representations to the different MR imagers 100. Using identification, a given MR imager 100 provides k-space data, which the interface 310 receives. The interface 310 then receives a representation or image from the server back-end and provides the representation or image to the MR imager 100, which provided the k-space data. The process is repeated for each of the MR imagers 100 as needed. The server back-end supports reconstruction for the group of MR imagers 100.

The server 320 includes the interface 310 or connects with the interface 310 to load balance. The server 320 is configured to load balance between the servers 220 or between processes for each server 220. For example, the server 320 load balances between the bank of servers 220, such as providing different sets of k-space data from different ones of the MR imagers 100 to different servers 220. Each given server 220 may operate on a number of sets of k-space data where the number is optimized for the processing and memory capability or availability for that server 220. As another example, the server 320 separates the processes and/or data from a given MR imager 100 for a given scan of a patient, load balancing across servers 220 and/or within a given server 220 (e.g., across processing units of a server 220).

The servers 220 may also load balance or load balance instead, such as load balancing processes and/or data across available processing resources of the server 220 itself. Similarly, the server 320 may perform reconstruction operations, such as being one of the servers 220 of the bank of servers 220.

The servers 220 connect with the interface 310 directly or through a computer network 300 or may connect indirectly, such as through the server 320. The servers 220 may be configured to load balance the k-space data to different processing units available at that sever 220. The servers 220 are configured to reconstruct representations from the k-space data. The reconstruction uses one or more machine-learned models, such as using different reconstruction processes and corresponding machine-learned models for different scans or sets of MR k-space data. Each server 220 applies a same reconstruction process and corresponding machine-learned model. Alternatively, or additionally, different servers 220 apply different reconstruction processes and corresponding machine-learned model. In another alternative, or additional embodiment, the different servers 220 have access to all or different sub-sets of a library of reconstruction processes and corresponding machine-learned models. For example, the server 320 or servers 220 are configured to select one of a plurality of the machine-learned models for reconstruction of each representation. The plurality of the machine-learned models including native machine-learned models and internal machine-learned models. Different reconstruction processes may be selected for different sets of k-space data.

This arrangement of FIG. 3 allows for on-demand and/or pay-per-use arrangements of reconstruction processes. The service is easily deployed at the MR imager 100 since the remote server implements the reconstruction process. The arrangement may likewise be used for prospective and/or retrospective studies, such as for studying performance of a new reconstruction processor and/or machine-learned model for reconstruction where changes may be easily made on the back-end server side. Due to the library, different representations may be reconstructed from the same k-space data using different reconstruction processes and/or supporting machine-learned models, allowing comparative testing. Similarly, the architecture may allow for calculation of key performance indicators (KPI) for reconstruction, such as speed of reconstruction, signal-to-noise level, measure of artifacts, contrast, resolution, and/or other measures of performance in MR image reconstruction. The KPIs may be provided to the MR imager 100 with or without a given representation, such as to allow an operator to select other reconstruction processes to be used by the servers 220. The KPIs are transmitted on a need basis for reference.

The various computers, servers, and/or processors are processors for communications and/or reconstruction. These processors may be the same or different ones of a general processor, digital signal processor, three-dimensional data processor, graphics processing unit, application specific integrated circuit, field programmable gate array, artificial intelligence processor, digital circuit, analog circuit, combinations thereof, or another now known or later developed device for processing. The processor is a single device, a plurality of devices, or a network. For more than one device, parallel or sequential division of processing may be used. Different devices making up the processor may perform different functions, such as reconstructing by one device and volume rendering by another device. The processor is configured by software, firmware, and/or hardware to reconstruct. The image processor operates pursuant to instructions stored on a non-transitory medium to perform various acts described herein.

Figure 4:
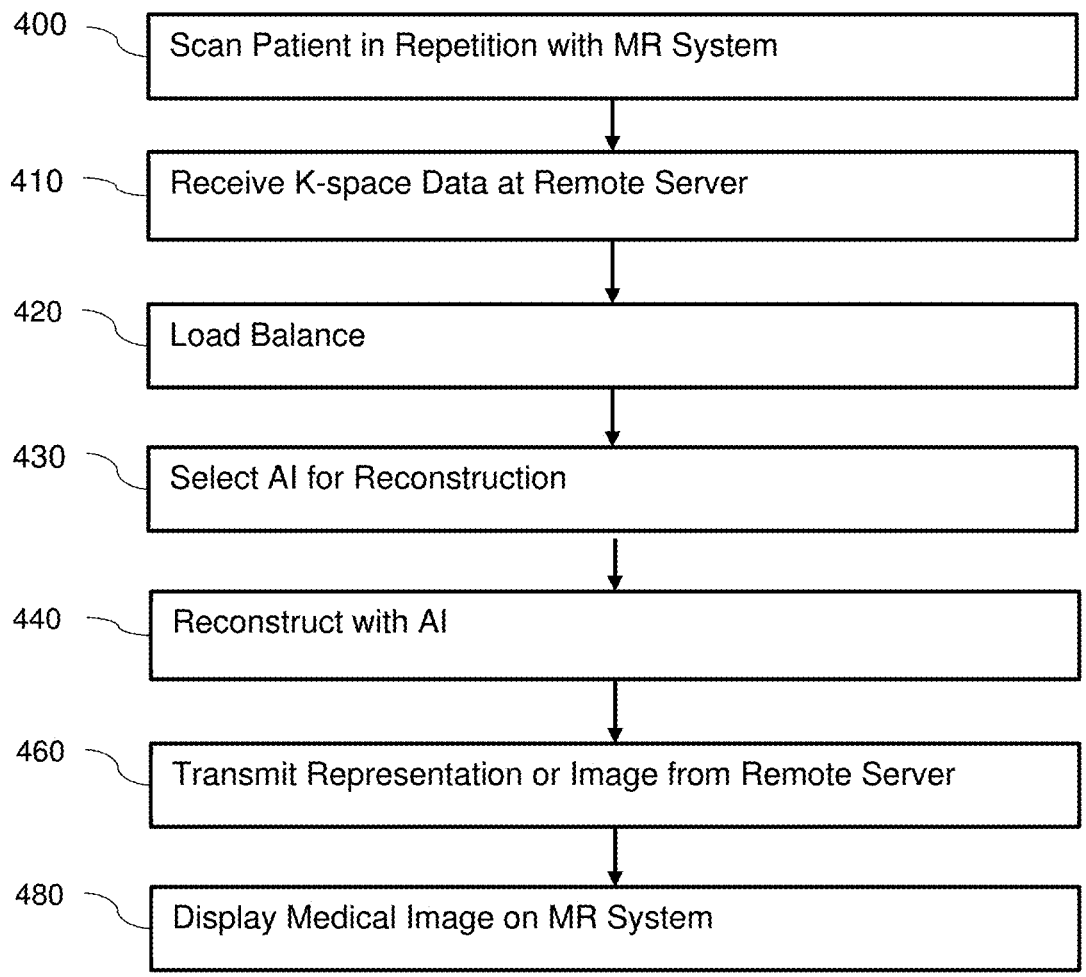
FIG. 4 is a flow chart diagram of one embodiment of a method for reconstruction using a machine-learned model at a computer remote from the MR system.

FIG. 4 is a flow chart diagram of one embodiment of a method for MR reconstruction of an MR image in medical imaging. The reconstruction is performed remotely from the MR scanner, allowing for more rapid reconstruction using a machine-learned model. A library of reconstruction processes and/or load balancing may be provided for AI-based reconstruction on a server side.

The method is performed by the system of FIG. 2, the system of FIG. 3, or another system. The MR scanner scans the patient. An interface at a remote location receives the k-space data from the scan. A server or bank of servers load balances, selects the AI-based reconstruction, and performs reconstruction. The interface transmits the resulting reconstruction or image from the reconstruction back to the MR scanner, which displays the image. Other components may be used.

The method is performed in the order shown (top to bottom or numerically) or other orders. For example, act 430 is performed prior to act 420. Additional, different, or fewer acts may be provided. For example, a preset, default, or user input settings are used to configure the scanning prior art act 400. As another example, the image is stored in a memory (e.g., computerized patient medical record) instead of or in addition to the display of act 480. In another example, acts 400 and 480 are not performed.

In act 400, the MR imager scans a patient. A pulse sequence is created based on the configuration of the MR scanner (e.g., the imaging protocol selected). Pulses of the pulse sequence are transmitted from coils into the patient. The resulting responses are measured by receiving radio frequency signals at the same or different coils. The scanning results in k-space measurements as the scan data.

In act 410, k-space data is received at a server. An interface of the server receives the k-space data from a scan over a computer network. The interface and server are remote from the MR imager (e.g., different building), so the computer network is used to communicate the k-space measurements from the MR imager to the server. A process of the MR imager collects and transfers the k-space data to the server. Any format may be used for the communication, such as an International Society of Magnetic Resonance in Medicine Raw Data format.

The interface and server may have more processing and/or memory resources than the MR imager. For example, the server is a supercomputer or workstation with multiple graphics cards. It may be more efficient to update a server than to update many MR imagers, so the server may more likely efficiently reconstruct using more recent and/or more complex reconstruction processes, including processes using AI.

In act 420, the server load balances the k-space data. The data itself may be load balanced by separating into processing blocks to be processed separately, such as in parallel or sequence. Different processing units (e.g., graphics processing units, central processing units, or cores) of a given server are used to process the different blocks.

The k-space data may be load balanced by assignment to a processor for reconstructing. K-space data from different scans and/or different MR imagers may be received. By distributing the sets of k-space data between different processors (e.g., different servers or workstations), the processing and/or memory burden is distributed or balanced (i.e., matched to available resources).

A combination of load balancing across servers and separation of k-space data for a scan into blocks may be performed. For example, the blocks or sub-sets for a given scan may be provided to one server as part of load balancing, which server load balances across processing units of that server for the sub-sets. As another example, different blocks or sub-sets for a given scan are load balanced across different servers.

In act 430, the server selects a reconstruction process from a library of reconstruction processes. Some or all the reconstruction processes include one or more machine-learned models. The machine-learned models of the different reconstruction processes are different, but one or more may be used in multiple reconstruction processes. The library may include publicly available reconstruction processes and/or custom or private reconstruction processes. The machine-learned models of the reconstruction processes may be in various languages, such as Python (e.g., models using publicly-available frameworks like Pytorch/Tensorflow/ etc. . . . ) or C++(e.g., created by a party for private use by that party).

The server selects the reconstruction process and corresponding machine-learned model based on the application, a request or input from the operator of the MR imager, performance metrics, and/or another criterion. For example, a most recently certified or tested reconstruction process for a given imaging application is selected based on the time of creation and/or performance (e.g., sharpness or noise level). More than one reconstruction process may be selected, such as to generate two reconstructions from the same k-space data for comparison or to highlight different information.

In act 440, the server reconstructs a representation from the load-balanced k-space data with the selected first reconstruction process and corresponding machine-learned model. For MR reconstruction, the k-space data is Fourier transformed into scalar values representing different spatial locations, such as spatial locations representing a plane through or volume of a region in the patient. Scalar pixel or voxel values are reconstructed as the MR image. The spatial distribution of measurements in object or image space is formed. This spatial distribution represents the patient. The reconstruction is performed, at least in part, using the machine-learned model, such as a neural network trained with deep machine learning. The machine-learned model is previously trained, and then used as trained in reconstruction. In response to the input of the scan data for a given repetition for a given patient, a patient specific image is reconstructed. The machine-learned model may output the image as pixels, voxels, and/or a display formatted image in response to the input or be used in another way in the reconstruction (e.g., for regularization or gradient prediction). The learned values and network architecture, with any algorithms (e.g., extrapolation and gradient update) determine the output from the input.

The output of the reconstruction, such the output of the machine-learned model, is a two-dimensional distribution of pixels representing an area of the patient and/or a three-dimensional distribution of voxels representing a volume of the patient. The output from the last reconstruction iteration may be used as the output representation of the patient.

Other processing may be performed on the input k-space measurements before Fourier transform. Other processing may be performed on the output representation or reconstruction, such as spatial filtering, color mapping, and/or display formatting. In one embodiment, the machine-learned network outputs voxels or scalar values for a volume spatial distribution. Volume rendering is performed to generate a display image. In alternative embodiments, the machine-learned network outputs the display image directly in response to the input. The pre- or post-processing is performed by the server or by the MR imager.

In act 460, the server or interface transmits the representation or an image from the representation to the remote MR imager over the computer network. Any format may be used, such as a digital imaging and communications in medicine (DICOM) or an International Society of Magnetic Resonance in Medicine Raw Data format. The results from the reconstruction are transmitted to the MR imagers that provided the k-space data for reconstruction. The results may be provided to a memory or patient digital record in other embodiments.

In act 480, a display (e.g., display screen or device) of the MR imager displays the MR image. Where the remote server reconstructs a representation not in an image format, the MR imager reformats. For example, the MR imager may perform volume or surface rendering for a volume or three-dimensional representation. As another example, pixels may be interpolated to the resolution, dynamic range, and/or aspect ratio of the display from a two-dimensional representation. The medical image, after or as part of any post processing, is formatted for display on the display. The display presents the image for viewing by the user, radiologist, physician, clinician, and/or patient. The image assists in diagnosis.

The displayed image may represent a planar region or area in the patient. Alternatively, or additionally, the displayed image is a volume or surface rendering from voxels (three-dimensional distribution) to the two-dimensional display.

Although the subject matter has been described in terms of exemplary embodiments, it is not limited thereto. Rather, the appended claims should be construed broadly, to include other variants and embodiments, which can be made by those skilled in the art.

What is claimed is:

1. A system for magnetic resonance (MR) reconstruction in medical imaging, the system comprising:
   an MR scanner configured to scan a region of a patient, the scan providing k-space data;
   a scanner processor of the MR scanner, the scanner processor configured to extract the k-space data from an imaging processing of the MR scanner, the scanner processor configured to format the k-space data for transmission over a computer network;
   a server remote from the MR scanner, the server communicatively connected to the scanner processor by the computer network, the server configured to reconstruct a representation from the k-space data with a reconstruction using a first machine-learned model selected from a library, wherein the scanner processor is configured to receive the representation and inject the received representation into the imaging process; and
   a display of the MR scanner configured to display an image from the representation.

2. The system of claim 1 wherein the scanner processor comprises a reconstruction processor of the MR scanner, the reconstruction processor being in an adjacent room to coils of the MR scanner, and wherein the server is outside of the adjacent room.

3. The system of claim 1 wherein the computer network comprises a local-area network, a wide-area network, or the Internet, and wherein the scanner processor is configured to format the k-space data pursuant to an International Society of Magnetic Resonance in Medicine Raw Data format.

4. The system of claim 1 wherein the server comprises a supercomputer.

5. The system of claim 1 wherein the server comprises a workstation having greater processing power than the scanner processor where the scanner processor comprises a reconstruction processor of the MR scanner.

6. The system of claim 1 wherein the server is configured to select the first machine-learned model from the library of multiple machine-learned models accessible to the server.

7. The system of claim 6 wherein the library includes a first set of the multiple machine-learned models in Python and a second set of the multiple machine-learned models in another language with a Python wrapper.

8. The system of claim 7 wherein the first set comprises publicly available machine-learned models and the second set comprises custom machine-learned models that are publicly unavailable.

9. The system of claim 1 wherein the server is configured to load balance with splitting of the k-space data for the scan of the patient.

10. The system of claim 1 wherein the server is one of multiple servers and the MR scanner is one of multiple MR scanners where k-space data from different ones of the MR scanners are load balanced between the multiple servers.

11. A method for magnetic resonance (MR) reconstruction in medical imaging, the method comprising:
    receiving k-space data over a computer network at a server from a remote MR imager;
    load balancing, by the server, the k-space data;
    selecting a first reconstruction process from a library of reconstruction processes, the reconstruction processes of the library including different machine-learned models;
    reconstructing a representation from the load-balanced k-space data with the selected first reconstruction process and corresponding machine-learned model; and
    transmitting the representation or an image from the representation to the remote MR imager over the computer network.

12. The method of claim 11 wherein receiving and transmitting comprise receiving and transmitting in an International Society of Magnetic Resonance in Medicine Raw Data format, wherein the remote MR imager is in a different building than the server, and the server comprises a supercomputer.

13. The method of claim 11 wherein load balancing comprises separating the k-space data for a scan of a patient into separate processing blocks for different processing units of the server.

14. The method of claim 11 wherein load balancing comprises assigning a processor for the reconstructing.

15. The method of claim 11 wherein selecting comprises selecting where the library includes publicly available reconstruction processes and custom reconstruction processes.

16. A system for magnetic resonance (MR) reconstruction in medical imaging, the system comprising:
    an interface configured to receive k-space data from a plurality of different MR imagers in one or more different facilities than the interface; and
    a first server connected with the interface, the first server configured to load balance the k-space data to different processing units of the first server and to reconstruct representations from the k-space data, the representations reconstructed using one or more machine-learned models;
    wherein the interface is configured to communicate the representations and/or images from the representations to the different MR imagers.

17. The system of claim 16 further comprising a second server, the second server configured to load balance the k-space data between a bank of servers including the first server.

18. The system of claim 16 wherein the first server is configured to select one of a plurality of the machine-learned models for reconstruction of each representation, the plurality of the machine-learned models including native machine-learned models and internal machine-learned models.

* * * * *